(12) United States Patent
Tsai et al.

(10) Patent No.: US 8,486,587 B2
(45) Date of Patent: Jul. 16, 2013

(54) METHOD FOR CORRECTING LAYOUT PATTERN AND METHOD FOR MANUFACTURING PHOTOMASK

(75) Inventors: Chen-Hua Tsai, Hsinchu County (TW); Chia-Wei Huang, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 56 days.

(21) Appl. No.: 13/330,680

(22) Filed: Dec. 20, 2011

(65) Prior Publication Data

US 2013/0157178 A1 Jun. 20, 2013

(51) Int. Cl.
*G03F 1/50* (2012.01)
*G03F 1/70* (2012.01)

(52) U.S. Cl.
USPC ......... 430/5; 430/22; 430/30; 716/51; 716/55

(58) Field of Classification Search
USPC ............................... 430/5, 22, 30; 716/51, 55
See application file for complete search history.

(56) References Cited

U.S. PATENT DOCUMENTS

| | | | |
|---|---|---|---|
| 6,033,811 A | 3/2000 | Lee |
| 6,395,438 B1 | 5/2002 | Bruce |
| 6,470,489 B1 | 10/2002 | Chang |
| 6,576,486 B2 | 6/2003 | Lin |
| 6,684,382 B2 | 1/2004 | Liu |
| 6,753,115 B2 | 6/2004 | Zhang |
| 6,763,514 B2 | 7/2004 | Zhang |
| 6,852,453 B2 | 2/2005 | Wu |
| 6,961,920 B2 | 11/2005 | Zach |
| 7,247,887 B2 | 7/2007 | King |
| 7,266,801 B2 | 9/2007 | Kotani |
| 7,386,829 B2 | 6/2008 | Lee |
| 7,617,475 B2 | 11/2009 | Lin |
| 7,624,369 B2 | 11/2009 | Graur |
| 2006/0066339 A1 | 3/2006 | Rajski |
| 2006/0085772 A1 | 4/2006 | Zhang |
| 2006/0161452 A1 | 7/2006 | Hess |
| 2007/0020565 A1 | 1/2007 | Koh |
| 2007/0158756 A1 | 7/2007 | Dreeskornfeld |
| 2008/0248429 A1 | 10/2008 | Chou |
| 2009/0193385 A1 | 7/2009 | Yang |
| 2009/0233238 A1 | 9/2009 | Hsu |
| 2009/0258500 A1 | 10/2009 | Yang |
| 2009/0278569 A1 | 11/2009 | Taoka |
| 2009/0300576 A1 | 12/2009 | Huang |
| 2010/0036644 A1 | 2/2010 | Yang |
| 2010/0070944 A1 | 3/2010 | Wu |
| 2010/0086862 A1 | 4/2010 | Yang |
| 2010/0131914 A1 | 5/2010 | Wu |
| 2010/0175041 A1 | 7/2010 | Krasnoperova |
| 2011/0029939 A1 | 2/2011 | Yang |

OTHER PUBLICATIONS

Chen, Interconnect Technology Conference and 2011 Materials for Advanced Metallization (IITC/MAM), 2011 IEEE International 14.2, "64 nm pitch Cu dual-damascene interconnects using pitch split double exposure patterning scheme", May 8, 2011.

*Primary Examiner* — Christopher Young
(74) *Attorney, Agent, or Firm* — Winston Hsu; Scott Margo

(57) ABSTRACT

A method for correcting a layout pattern includes the following steps. A first layout pattern, a second layout pattern, and a mis-alignment value are provided. The first layout pattern includes a first conducting line pattern, and the second layout pattern includes at least one contact via pattern. The contact via pattern at least partially overlaps the first conducting line pattern. The layout pattern is verified whether spacing between the contact via pattern and the first conducting line pattern is smaller than the mis-alignment value by a computing system. A first modified contact via pattern is then obtained by expanding the contact via pattern along a direction away from the spacing smaller than the mis-alignment value.

19 Claims, 10 Drawing Sheets

METHOD FOR CORRECTING LAYOUT PATTERN AND METHOD FOR MANUFACTURING PHOTOMASK

BACKGROUND OF THE INVENTION

1. Field of the Invention

The present invention relates to a method for correcting a layout pattern and a method for manufacturing a photomask, and more particularly, to a method for correcting a layout pattern including a contact via pattern overlapping a conducting line pattern and a method for manufacturing a photomask thereof.

2. Description of the Prior Art

In semiconductor manufacturing processes, in order to transfer an integrated circuit onto a semiconductor wafer, the integrated circuits from a database are first designed as a layout pattern and a photomask is then manufactured according to the layout pattern. Patterns on the photomask may then be able to be transferred to the semiconductor wafer. The steps mentioned above may be regarded as a photolithographic process. The layout pattern has to be extremely accurate for forming delicate integrated circuits so as to align with the patterns of the previous and following steps.

In the photolithographic process, deviations often occur when the patterns on the photomask are transferred onto the wafer surface and jeopardize the performance of the semiconductor device. Such deviations are usually related to the alignment accuracy condition of the exposure machines. If a contact via pattern is shifted by mis-alignment, electrical properties of a semiconductor device may be influenced especially for the semiconductors of multilevel interconnects where the contact via pattern is designed for overlapping the upper and the lower conducting line pattern.

In the conventional method for correcting layout patterns, the conducting line pattern is corrected to compensate the influence of mis-alignment, especially for the conducting line patterns with predetermined parts overlapping contact via patterns. The effective overlapping area between the contact via pattern and the modified conducting line pattern will not be affected, even if mis-alignments really occur.

Additionally, as the complexity and integration of integrated circuits continue to progress, the design rules of lines width and space between lines or devices become finer for photolithographic processes. However, the width is influenced by the exposure wavelength used in the lithographic process, and extremely small space may not be obtained through a single exposure process. Therefore, a double-exposure technique has been developed for decomposing a target pattern into two separated patterns, which are then transferred to a photoresist layer by two exposure processes successively. However, the conventional method for correcting layout patterns may not be suitable for the double-exposure technique, since the space between conducting line patterns is close to a critical space value, and the alignment condition between two exposure processes has to be also considered. In addition, a self-aligned via (SAV) design is preferably employed with the double-exposure technique, and the size of the contact via may not be further modified by tuning related etching processes under the self-aligned via design. Therefore, the modification of the contact via pattern becomes more important.

SUMMARY OF THE INVENTION

It is one of the objectives of the present invention to provide a method for correcting a layout pattern and a method for manufacturing a photomask. Contact via patterns are corrected for compensating the influence of mis-alignment in exposure processes.

According to a preferred embodiment of the present invention, a method for correcting a layout pattern includes the following steps. First, a first layout pattern, a second layout pattern, and a mis-alignment value are provided. The first layout pattern includes a first conducting line pattern, the second layout pattern includes at least one contact via pattern, and the contact via pattern at least partially overlaps the first conducting line pattern. The layout pattern is then verified whether spacing between the contact via pattern and the first conducting line pattern is smaller than the mis-alignment value by a computing system. A first modified contact via pattern is then obtained by expanding the contact via pattern along a direction away from the spacing smaller than the mis-alignment value.

According to another preferred embodiment of the present invention, a method for manufacturing a photomask includes the following steps. First, a first layout pattern, a second layout pattern, and a mis-alignment value are provided. The first layout pattern includes a first conducting line pattern, the second layout pattern includes at least one contact via pattern, and the contact via pattern at least partially overlaps the first conducting line pattern. The layout pattern is then verified whether spacing between the contact via pattern and the first conducting line pattern is smaller than the mis-alignment value by a computing system. A first modified contact via pattern is then obtained by expanding the contact via pattern along a direction away from the spacing smaller than the mis-alignment value. The second layout pattern is then output to at least one photomask.

According to further another preferred embodiment of the present invention, a method for manufacturing a photomask includes the following steps. First, a first layout pattern, a second layout pattern, a third layout pattern, a mis-alignment value, and a critical space value are provided. The first layout pattern includes a first conducting line pattern, the second layout pattern includes at least one contact via pattern, the third layout pattern includes a second conducting line pattern and a third conducting line pattern. The contact via pattern at least partially overlaps the first conducting line pattern, and the contact via pattern at least partially overlaps the second conducting line pattern. The layout pattern is then verified whether spacing between the contact via pattern and the first conducting line pattern is smaller than the mis-alignment value by a computing system. A first modified contact via pattern is then obtained by expanding the contact via pattern along a direction away from the spacing smaller than the mis-alignment value. The first modified contact via pattern is then verified whether spacing between the first modified contact via pattern and the third conducting line pattern is smaller than the critical space value by the computing system. A second modified contact via pattern is then obtained by shrinking the first modified contact via pattern along a direction away from the spacing smaller than the critical space value, and spacing between the second modified contact via pattern and the third conducting line pattern is larger than or equal to the critical space value. The second layout pattern is then output to at least one photomask.

These and other objectives of the present invention will no doubt become obvious to those of ordinary skill in the art after reading the following detailed description of the preferred embodiment that is illustrated in the various figures and drawings.

DETAILED DESCRIPTION

The present invention may be employed for many kinds of stacking structures such as structures with contact plugs overlapping doped regions, multilevel interconnects with conducting lines overlapping plugs, and dual damascene structures with trenches overlapping via holes. In other words, the present invention may be employed for effectively solving the problem that the layout patterns with upper patterns overlapping lower patterns may be influenced by mis-alignment issues. The process window of the semiconductor process employing the double-exposure technique, the multiple exposure technique, or the self-aligned via (SAV) design may therefore be enhanced. The yield of the semiconductor process and the reliability semiconductor device may also be improved.

Figure 1:
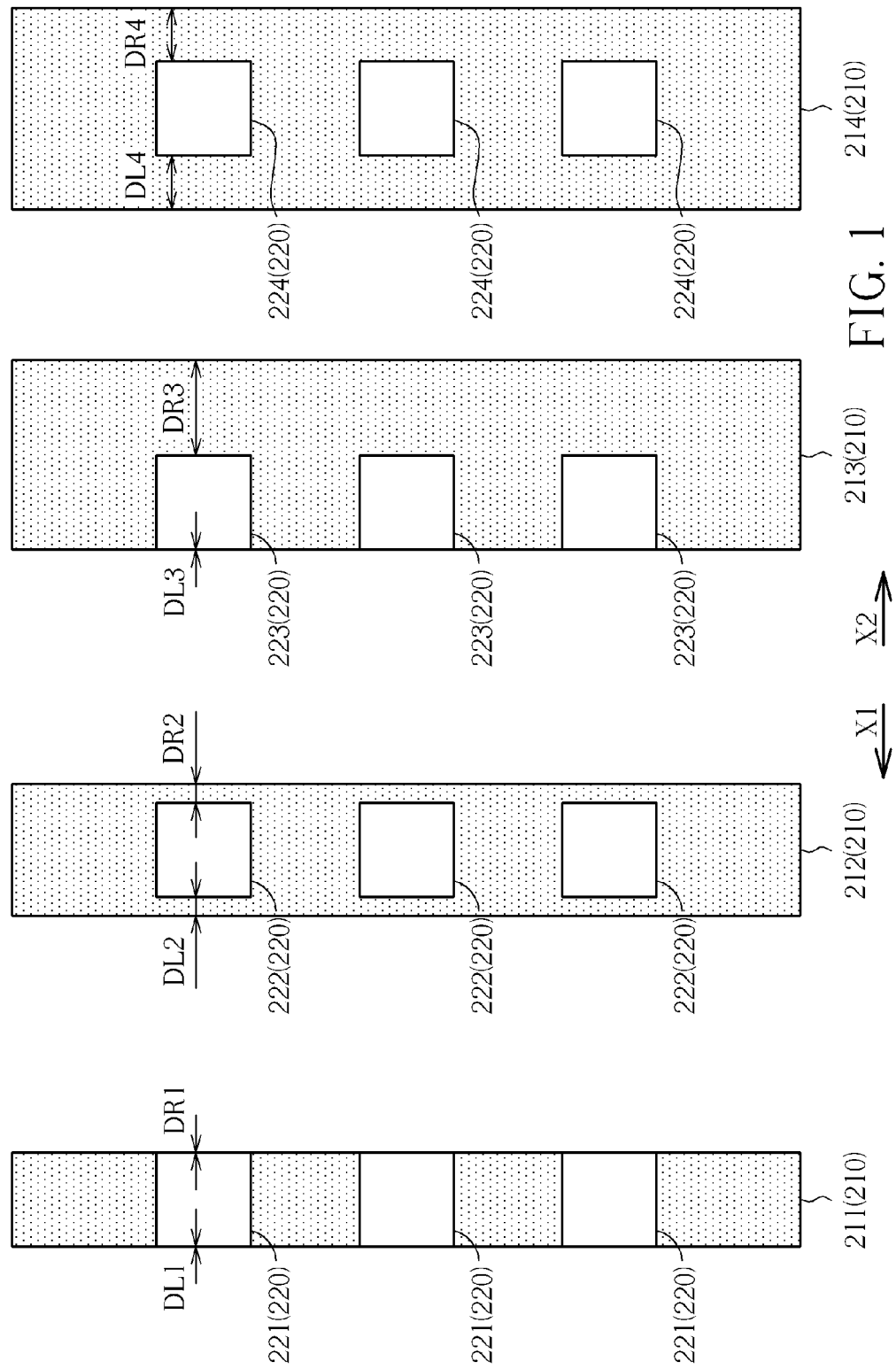
FIGS. 1-3 are schematic diagrams illustrating a method for correcting a layout pattern according to the first preferred embodiment of the present invention.
Figure 2:
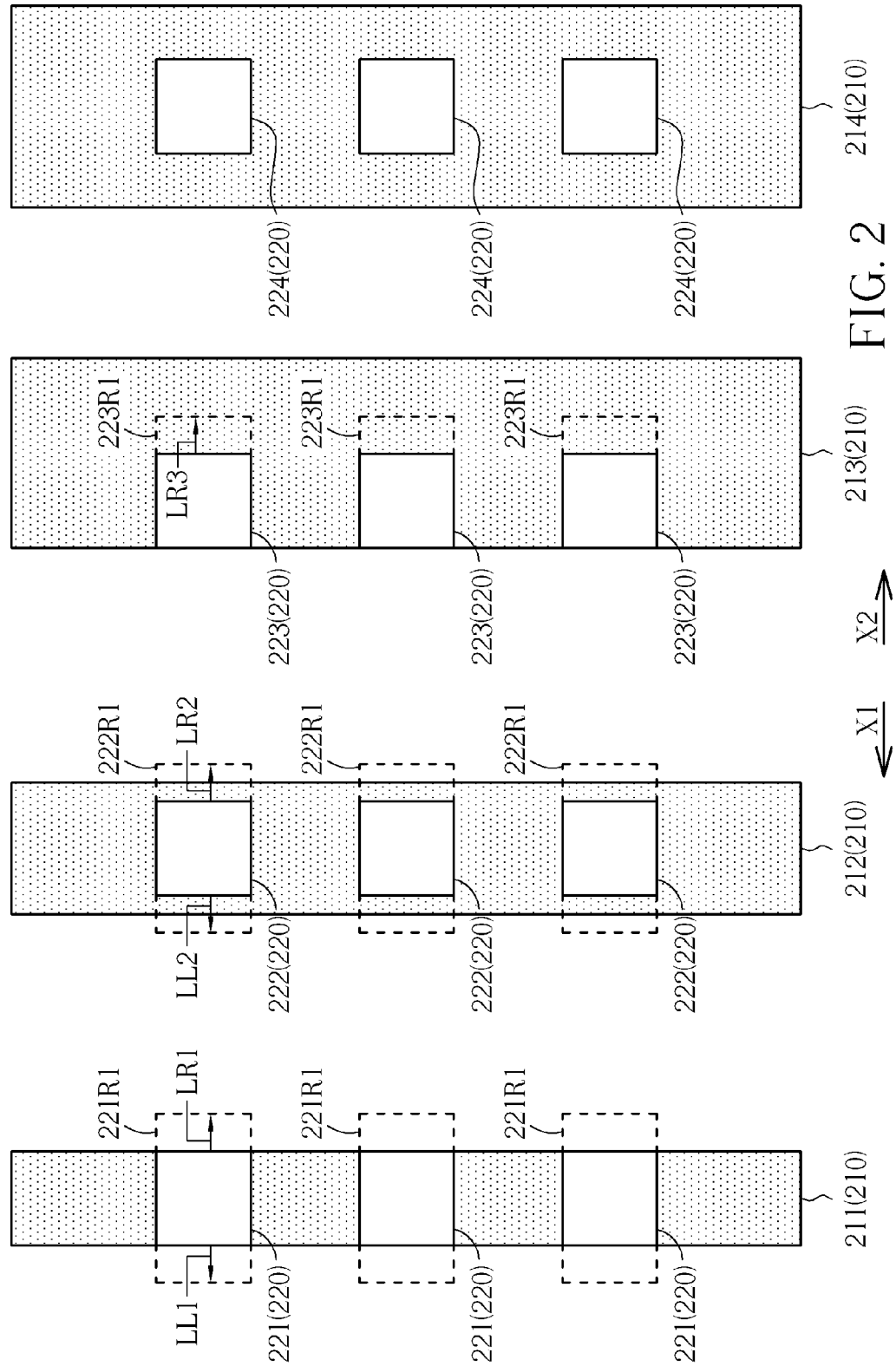
Figure 3:
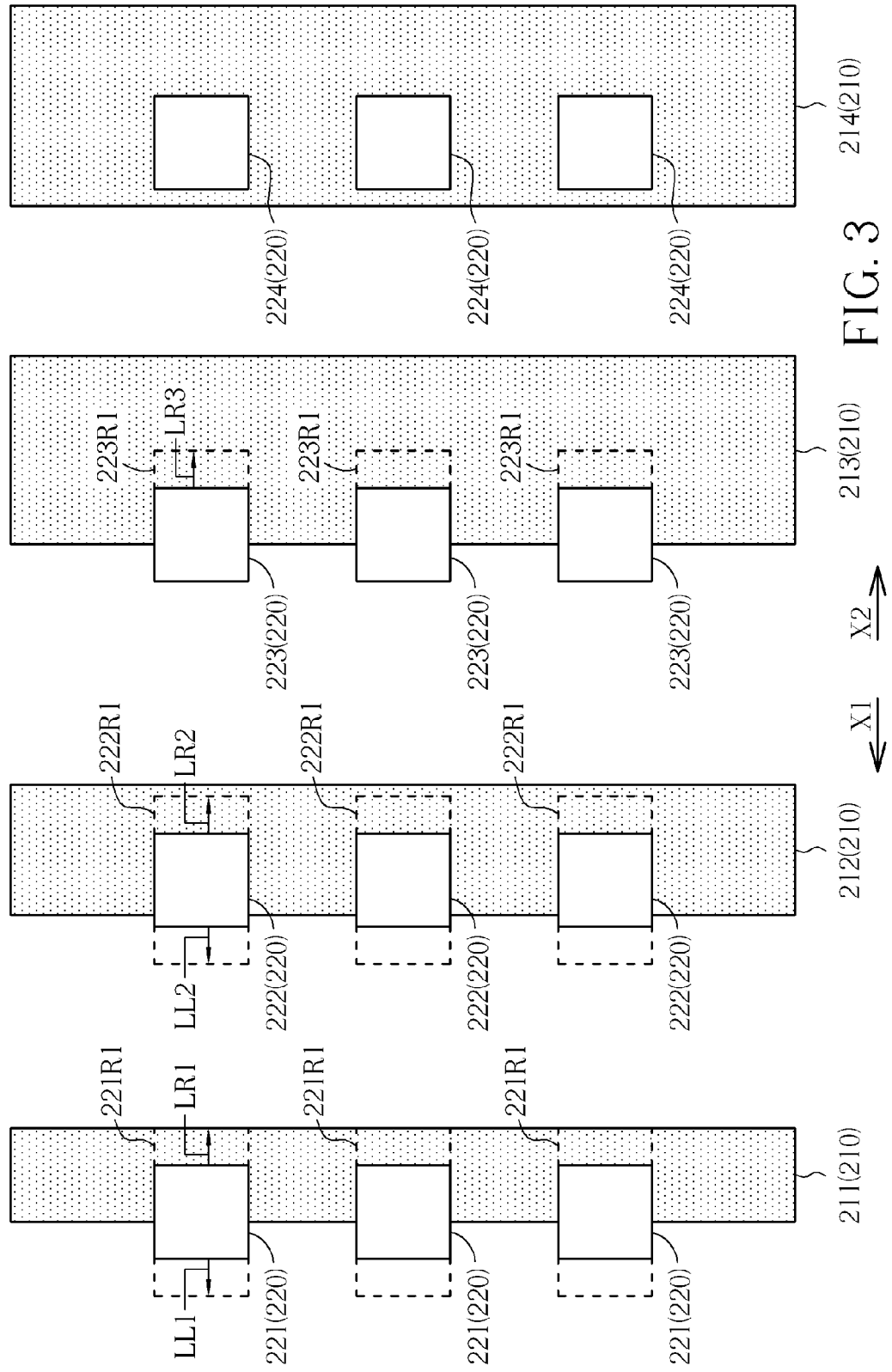
Figure 4:
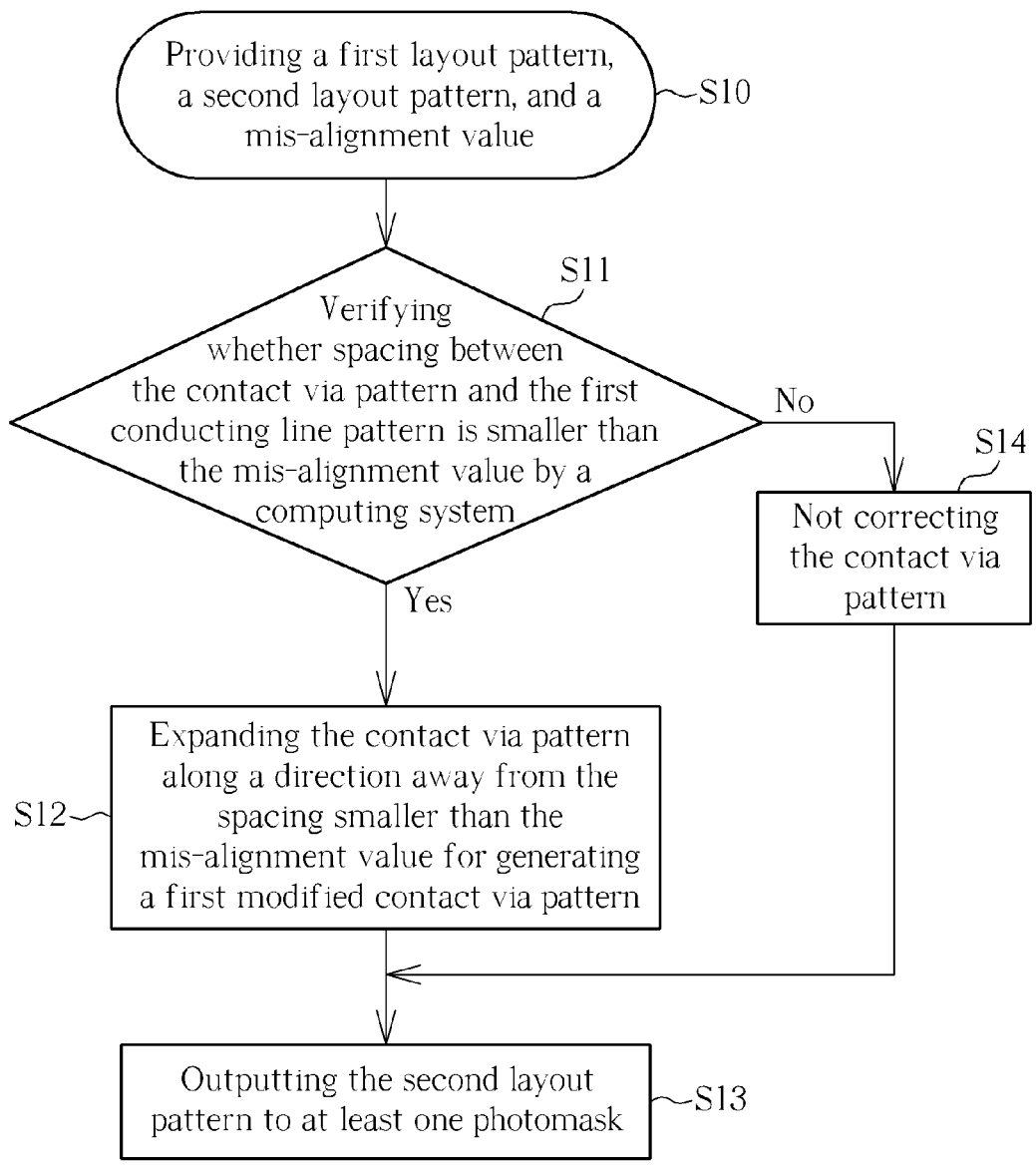
FIG. 4 is a flowchart describing a method for correcting a layout pattern according to the first preferred embodiment of the present invention.

Please refer to FIGS. 1-4. FIGS. 1-3 are schematic diagrams illustrating a method for correcting a layout pattern according to the first preferred embodiment of the present invention. FIG. 4 is a flowchart describing a method for correcting a layout pattern according to the first preferred embodiment of the present invention. As shown in FIGS. 1-4, the method for correcting the layout pattern in this embodiment includes the following steps. First, in step S10, a first layout pattern 210, a second layout pattern 220, and a mis-alignment value are provided from a database. The first layout pattern 210 includes a plurality of first conducting line patterns, and the second layout pattern 220 includes a plurality of contact via patterns. In this embodiment, the second layout pattern 220 may include a plurality of contact via patterns 221, and the first layout pattern 210 may include a first conducting line pattern 211. The contact via pattern 221 overlaps the first conducting line pattern 211. In other words, corresponding positions of the contact via pattern 221 and the first conducting line pattern 211 overlap each other after being transferred onto a wafer by a photolithographic process. For further describing different configurations of the method for correcting the layout pattern in this embodiment, the second layout pattern 220 may include a plurality of contact via patterns 222, a plurality of contact via patterns 223, and a plurality of contact via patterns 224; and the first layout patterns 210 may include a first conducting line pattern 212, a first conducting line pattern 213, and a first conducting line pattern 214; but the present invention is not limited to this.

The first layout pattern 210 may only include one first conducting line pattern, and the second layout pattern 220 may only include one contact via pattern. each of the contact via pattern 222 overlaps the first conducting line pattern 212, each of the contact via pattern 223 overlaps the first conducting line pattern 213, and each of the contact via pattern 224 overlaps the first conducting line pattern 214.

In step S11, the first layout pattern 210 and the second layout pattern 220 are then verified whether spacing between the contact via pattern and the first conducting line pattern is smaller than the mis-alignment value by a computing system such as a computer, but not limited thereto. The mis-alignment value is substantially smaller than 10 nanometers, but the present invention is not limited to this, and the mis-alignment value may vary, depending on different exposure machines. For example, in this embodiment, spacing DL1 and spacing DR1 between the contact via pattern 221 and the first conducting line pattern 211, spacing DL2 and spacing DR2 between the contact via pattern 222 and the first conducting line pattern 212, spacing DL3 and spacing DR3 between the contact via pattern 223 and the first conducting line pattern 213, and spacing DL4 and spacing DR4 between the contact via pattern 224 and the first conducting line pattern 214 may be verified whether the spacing DL1, the spacing DR1, the spacing DL2, the spacing DR2, the spacing DL3, the spacing DR3, the spacing DL4, and the spacing DR4 are smaller than the mis-alignment value.

Subsequently, in step S14, if the spacing between the contact via pattern and the corresponding first conducting line pattern is not smaller than the mis-alignment value, the contact via pattern will not be corrected. Conversely, in step S12, if the spacing between the contact via pattern and the corresponding first conducting line pattern is smaller than the mis-alignment value, a first modified contact via pattern may then be obtained by expanding the contact via pattern along a direction away from the spacing smaller than the mis-alignment value.

In this embodiment, since the spacing DL1 and the spacing DR1 are smaller than the mis-alignment value, a first modified contact via pattern 221R1 (presented by dashed lines in FIG. 2) may be obtained by expanding the contact via pattern 221 along a direction X1 and a direction X2, which are respectively away from the spacing DR1 and the spacing DL1. According to the same rule, because the spacing DL2 and the spacing DR2 are smaller than the mis-alignment value, a first modified contact via pattern 222R1 (presented by dashed lines in FIG. 2) may be obtained by expanding the contact via pattern 222 along a direction X1 and a direction X2, which are respectively away from the spacing DR2 and the spacing DL2. Additionally, because the spacing DL3 is smaller than the mis-alignment value and the spacing DR3 is not smaller than the mis-alignment value, a first modified contact via pattern 223R1 (presented by dashed lines in FIG. 2) may be obtained by expanding the contact via pattern 223 along a direction X2, which is away from the spacing DL3. It is worth noting that, because both the spacing DL4 and the spacing DR4 are not smaller than the mis-alignment value, the contact via pattern 224 may not be corrected. The influences of mis-alignment which may occur in the subsequent exposure process may be effectively reduced by employing the method for correcting the layout pattern of this embodiment.

In this embodiment, the method of expanding the contact via pattern may include expanding the contact via pattern along the direction with an additional length. For example, as shown in FIG. 2, the first modified contact via pattern 221R1 may be obtained by expanding the contact via pattern 221 along the direction X1 with an additional length LL1 and expanding the contact via pattern 221 along the direction X2 with an additional length LR1. The first modified contact via pattern 222R1 may be obtained by expanding the contact via pattern 222 along the direction X1 with an additional length LL2 and expanding the contact via pattern 222 along the direction X2 with an additional length LR2. The first modified contact via pattern 223R1 may be obtained by expanding the contact via pattern 223 along the direction X2 with an additional length LR3. It is worth noting that the additional length LL1, the additional length LR1, the additional length LL2, the additional length LR2, and the additional length LR3 are preferably larger than or equal to the mis-alignment value, but not limited to this. For further description, a difference between the mis-alignment value and the spacing between the contact via pattern and the first conducting line pattern is preferably smaller than or equal to the additional length, i.e. a difference between the mis-alignment value and the spacing DL1 is preferably smaller than or equal to the additional length LR1, a difference between the mis-alignment value and the spacing DR1 is preferably smaller than or equal to the additional length LL1, a difference between the mis-alignment value and the spacing DL2 is preferably smaller than or equal to the additional length LR2, a difference between the mis-alignment value and the spacing DR2 is preferably smaller than or equal to the additional length LL2, and a difference between the mis-alignment value and the spacing DL3 is preferably smaller than or equal to the additional length LR3, but not limited thereto.

According to the method for correcting the layout patterns in this embodiment, overlapped regions between the first layout pattern 210 and the second layout pattern 220 may be compensated when the mis-alignment issue occurs. For example, as shown in FIG. 3, the first layout pattern 210 is influenced by the mis-alignment issue and shifted toward the direction X2. The overlapped regions between the first modified contact via pattern 221R1 and the corresponding first conducting line pattern 211, the overlapped regions between the first modified contact via pattern 222R1 and the corresponding first conducting line pattern 212, and the overlapped regions between the first modified contact via pattern 223R1 and the corresponding first conducting line pattern 213 may still be kept in required sizes.

Figure 5:
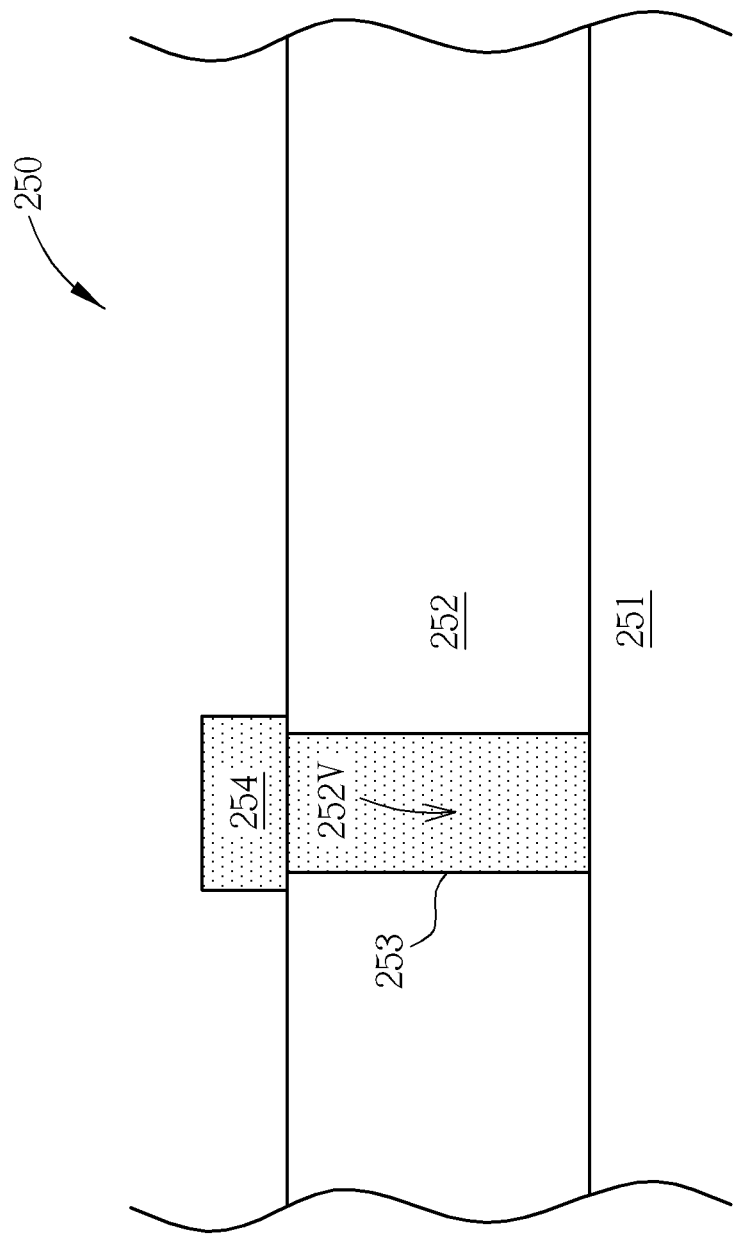
FIG. 5 is a schematic diagram illustrating a semiconductor device related to a method for correcting a layout pattern according to the first preferred embodiment of the present invention.

For further describing a semiconductor device manufactured by employing the method for correcting the layout pattern of this embodiment, please refer to FIG. 5 and FIG. 2. FIG. 5 is a schematic diagram illustrating a semiconductor device related to a method for correcting a layout pattern according to the first preferred embodiment of the present invention. As shown in FIG. 5, a semiconductor device 250 related to the method for correcting the layout pattern of this embodiment includes a semiconductor substrate 251, a dielectric layer 252, and a metal conducting line 254. The dielectric layer 252 has a contact via 252V, and the metal conducting line 254 may be electrically connected to the semiconductor substrate 251 via a contact plug 253 formed in the contact via 252V. As shown in FIG. 5 and FIG. 2, in the method for correcting the layout pattern of this embodiment, a photo mask, which is manufactured according to the first layout pattern 210 including the first conducting line pattern, may be employed for defining the metal conducting line 254, and a photomask, which is manufactured according to the second layout pattern 220 including the contact via pattern, may be employed for defining the contact via 252V. Therefore, an effective contact area between the metal conducting line 254 and the contact plug 253 may not be influenced by the mis-alignment issue when the first modified contact via pattern obtained by the method for correcting the layout pattern is employed for defining the contact via 252V. In other words, the effective contact area may be ensured by employing the modified contact via pattern because the modified contact via pattern is widen for overlapping the conducting line pattern which may be shifted by the mis-alignment issue. This way, the electrical properties and the reliability of the semiconductor device 250 may then be enhanced. It is worth noting that the method for correcting the layout pattern of this embodiment is not limited to be employed for manufacturing the semiconductor device 250 and may also be employed for manufacturing other semiconductor devices with overlapped structures including a doped region, a contact via, or a conducting line.

Please refer to FIG. 4 and FIG. 2 again. As shown in FIG. 4 and FIG. 2, in the first preferred embodiment, a method for manufacturing a photomask is provided. The method for manufacturing the photomask in this embodiment includes the method for correcting the layout pattern described above, and the method for manufacturing the photomask in this embodiment further includes outputting the second layout pattern 220, which includes the first modified contact via pattern, to at least one photomask. In other words, the method for manufacturing the photomask in this embodiment further includes a step S13 after the step S12. In step S13, the first modified contact via patterns such as the first modified contact via patterns 221R1, the first modified contact via patterns 222R1, and the first modified contact via patterns 223R1 are then output to at least one photomask. It is worth noting that the first modified contact via patterns 221R1, the first modified contact via patterns 222R1, and the first modified contact via patterns 223R1 may also be output to different photomasks for forming contact via by single exposure process or multiple exposure processes. The first layout pattern 210 including the first conducting line pattern may be output to at least one photomask without being corrected. It is worth noticing that the second layout pattern 220 may further include the contact via patterns, which are not required to be corrected after being verified by the computing system, but the present invention is not limited to this.

In the present invention, the problem that the layout patterns with upper patterns overlapping lower patterns may be influenced by mis-alignment issues is improved by correcting the contact via patterns in stead of correcting the conducting line patterns. In the method for manufacturing the photomask of this embodiment, the first modified contact via pattern may be output to at least one photomask, and other conducting line patterns may not be corrected for alignment considerations between the upper patterns and the lower patterns. However, the first layout pattern 210 and the second layout pattern 220 may respectively. be further corrected by ordinary correcting procedures such as optical proximity correction (OPC), process rule check (PRC), and lithography rule check (LRC) before being output to photomasks, but the present invention is not limited to this and related details will not be redundantly described.

Figure 6:
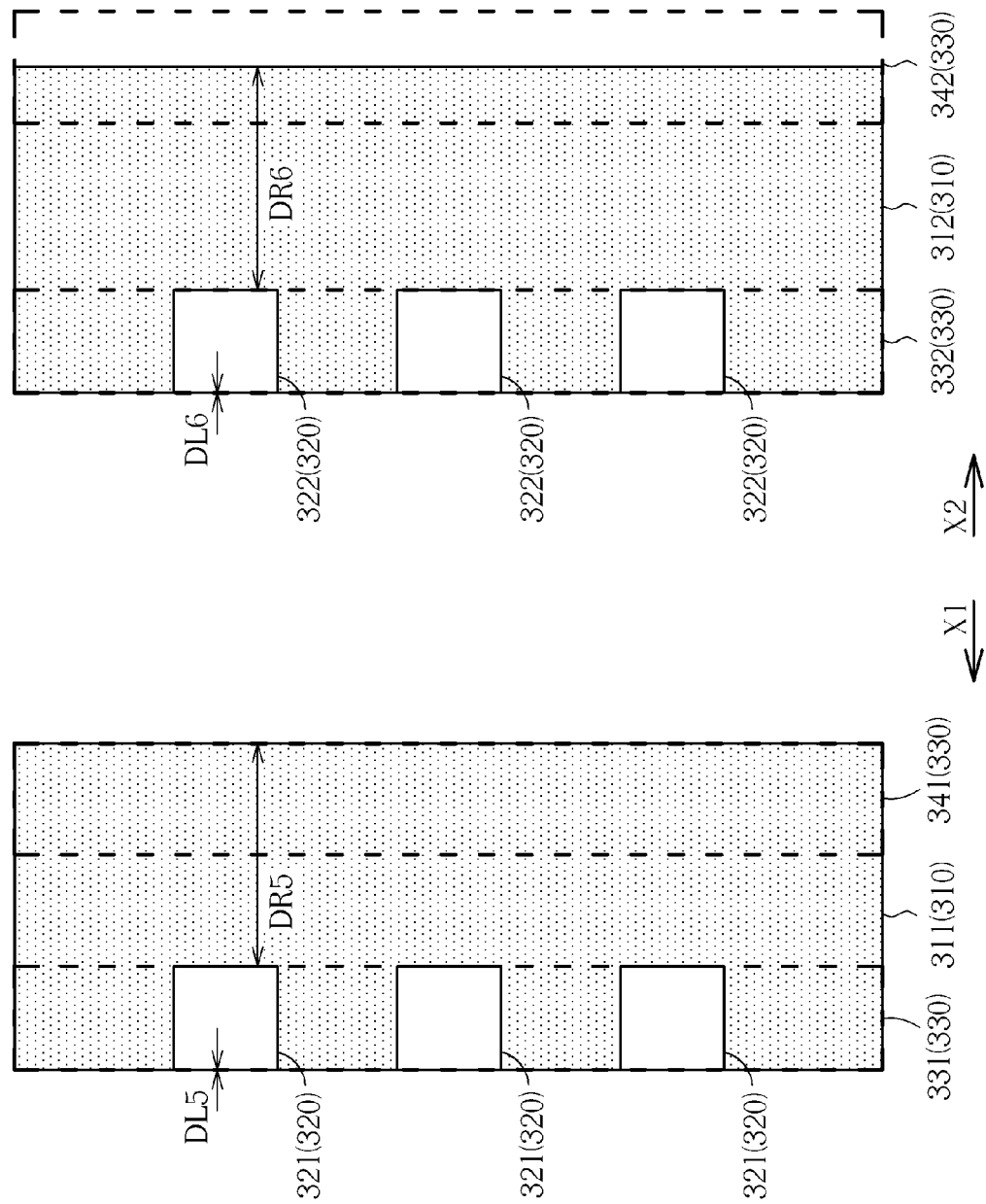
FIGS. 6-8 are schematic diagrams illustrating a method for correcting a layout pattern according to the second preferred embodiment of the present invention.
Figure 7:
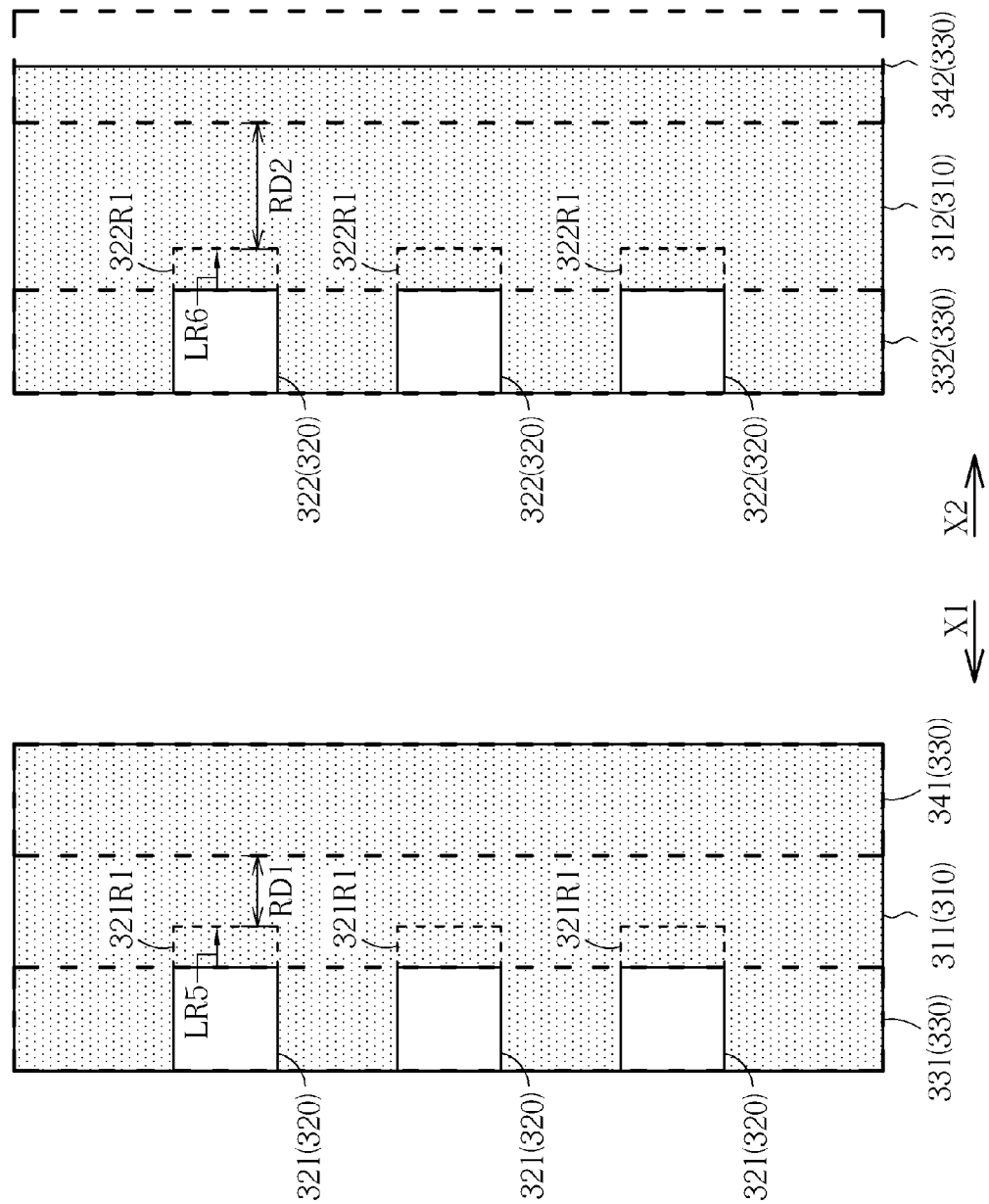
Figure 8:
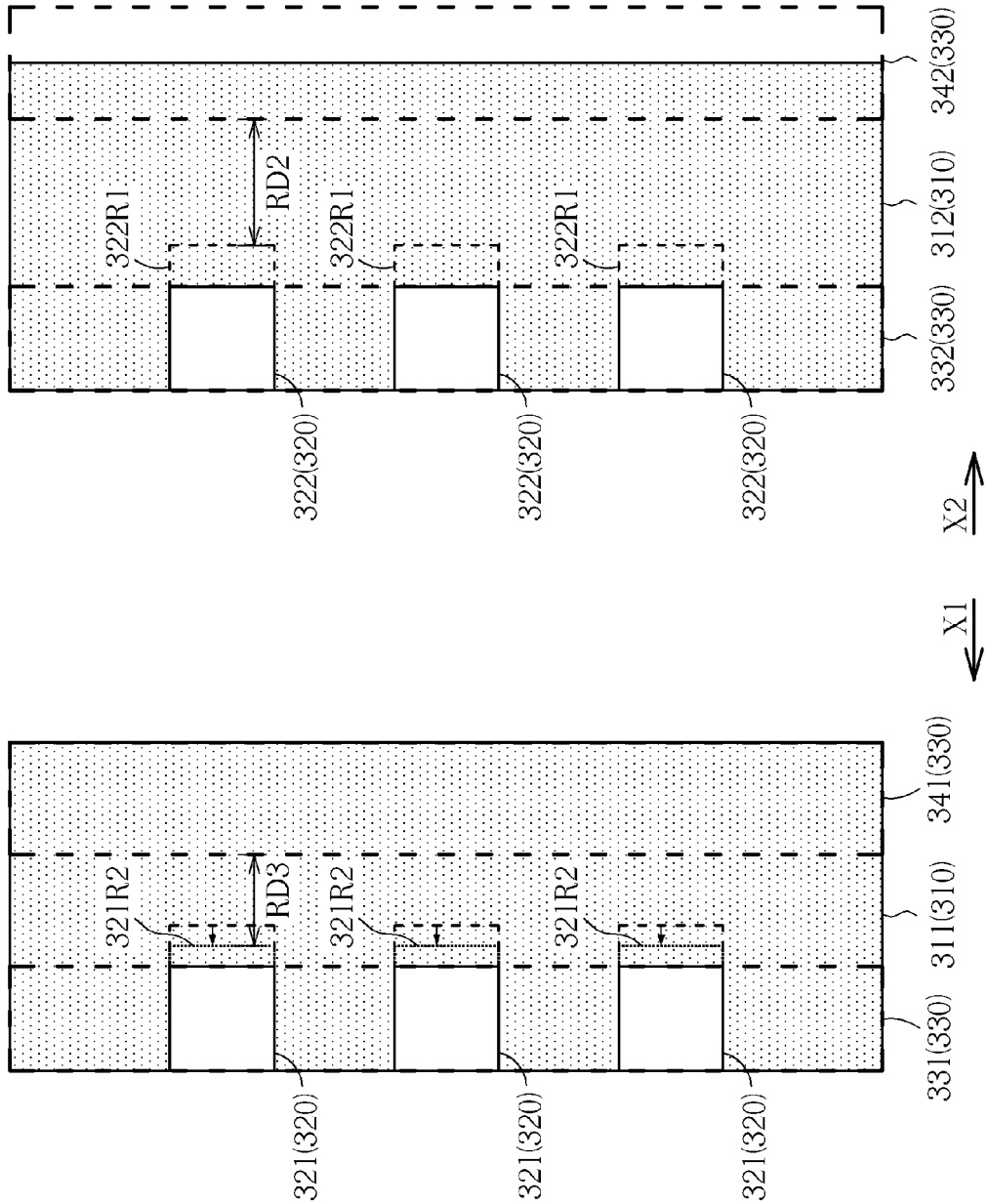
Figure 9:
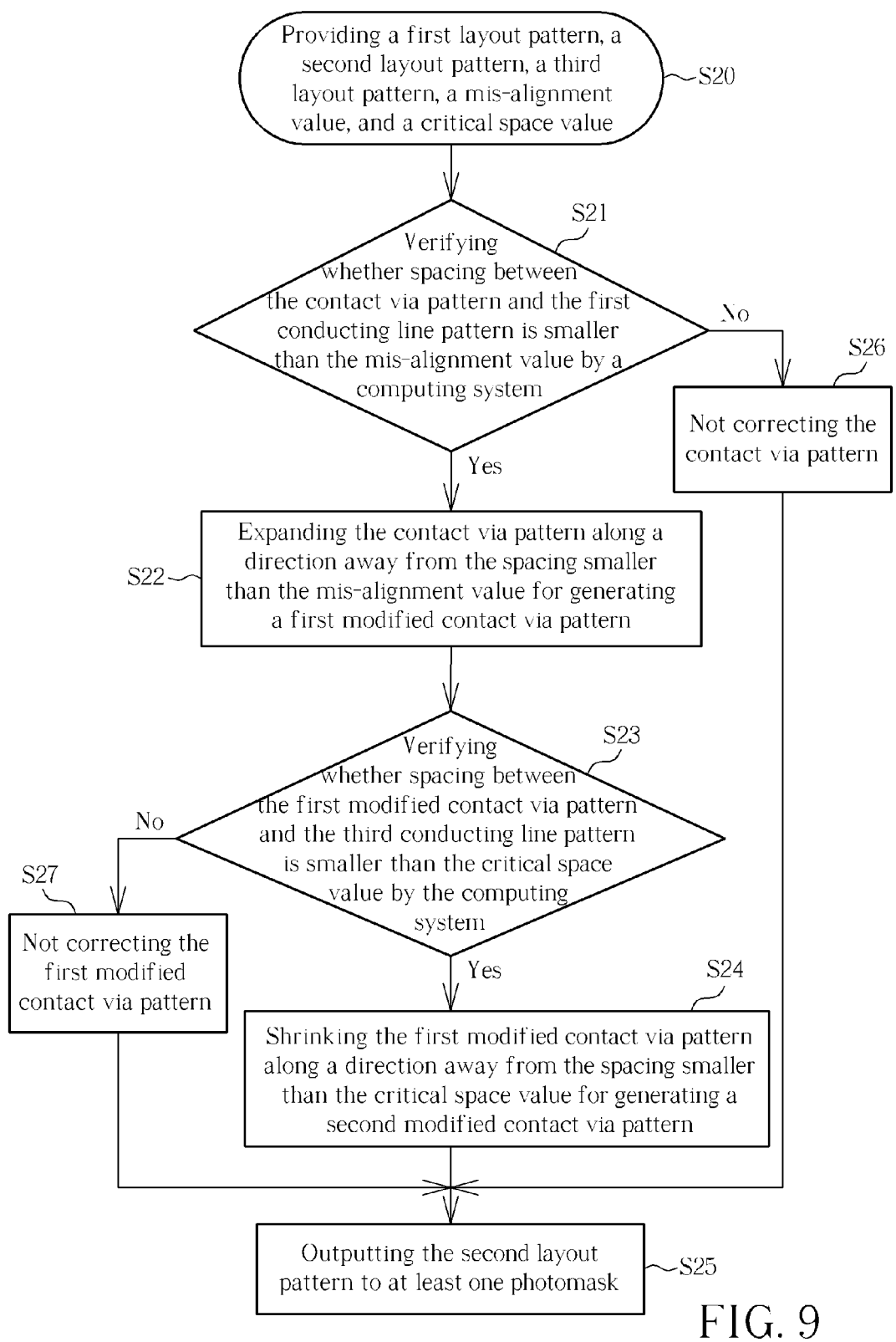
FIG. 9 is a flowchart describing a method for correcting a layout pattern according to the second preferred embodiment of the present invention.

Please refer to FIGS. 6-9. FIGS. 6-8 are schematic diagrams illustrating a method for correcting a layout pattern according to the second preferred embodiment of the present invention. FIG. 9 is a flowchart describing a method for correcting a layout pattern according to the second preferred embodiment of the present invention. As shown in FIGS. 6-9, the method for correcting the layout pattern in this embodiment includes the following steps. First, in step S20, a first layout pattern 310, a second layout pattern 320, a third layout pattern 330, a mis-alignment value, and a critical space value are provided from a database. The first layout pattern 310 may include a plurality of first conducting line patterns, the second layout pattern 320 may include a plurality of contact via patterns, and the third layout pattern 330 may include a plurality of second conducting line patterns and a plurality of third conducting line patterns. In this embodiment, the second layout pattern 320 may include a plurality of contact via patterns 321, the first layout pattern 310 may include a first conducting line pattern 311, and the third layout pattern 330 may include a second conducting line pattern 331 and a third conducting line pattern 341. The contact via pattern 321 overlaps the first conducting line pattern 311 and the contact via pattern 321 overlaps the second conducting line pattern 331. In other words, corresponding positions of the contact via pattern 321 and the first conducting line pattern 311 overlap each other after being transferred onto a wafer by a photolithographic process, and corresponding positions of the contact via pattern 321 and the third conducting line pattern 331 overlap each other after being transferred onto a wafer by a photolithographic process. The contact via pattern 321 is employed for connecting an upper conducting line pattern with a lower conducting line pattern. For further describing different configurations of the method for correcting the layout pattern in this embodiment, the second layout patterns 320 may further include a plurality of contact via patterns 322, the first layout pattern 310 may further include a first conducting line pattern 312, the third layout pattern 330 may further include a second conducting line pattern 332 and a third conducting line pattern 342, but the present invention is not limited to this and the second layout pattern 320 may only include one contact via pattern, the first layout pattern 310 may only include one first conducting line pattern, and the third layout pattern 330 may only include one second conducting line pattern and one third conducting line pattern. The contact via pattern 322 overlaps the first conducting line pattern 312, and the contact via pattern 322 overlaps the second conducting line pattern 332.

In step S21, the first layout pattern 310 and the second layout pattern are then verified whether spacing between the contact via pattern and the first conducting line pattern is smaller than the mis-alignment value by a computing system. For example, in this embodiment, spacing DL5 and spacing DR5 between the contact via pattern 321 and the first conducting line pattern 311, and spacing DL6 and spacing DR6 between the contact via pattern 322 and the first conducting line pattern 312 may be verified whether the spacing DL5, the spacing DR5, the spacing DL6, and the spacing DR6 are smaller than the mis-alignment value. Subsequently, in step S26, if the spacing between the contact via pattern and the corresponding first conducting line pattern is not smaller than the mis-alignment value, the contact via pattern will not be corrected. Conversely, in step S22, if the spacing between the contact via pattern and the corresponding first conducting line pattern is smaller than the mis-alignment value, a first modified contact via pattern may then be obtained by expanding the contact via pattern along a direction away from the spacing smaller than the mis-alignment value. In this embodiment, since the spacing DL5 is smaller than the mis-alignment value and the spacing DR5 is not smaller than the mis-alignment value, a first modified contact via pattern 321R1 (presented by thinner dashed lines in FIG. 7) may be obtained by expanding the contact via pattern 321 along a direction X2, which is away from the spacing DL5. Similarly, since the spacing DL6 is smaller than the mis-alignment value and the spacing DR6 is not smaller than the mis-alignment value, a first modified contact via pattern 322R1 (presented by thinner dashed lines in FIG. 7) may be obtained by expanding the contact via pattern 322 along a direction X2, which is away from the spacing DL6.

In this embodiment, the method of expanding the contact via pattern may include expanding the contact via pattern along the direction by extending its length. For example, as shown in FIG. 7, the first modified contact via pattern 321R1 may be obtained by expanding the contact via pattern 321 along the direction X2 with an additional length LR5. The first modified contact via pattern 322R1 may be obtained by expanding the contact via pattern 322 along the direction X2 with an additional length LR6. It is worth noting that the additional length LR5 and the additional length LR6 are preferably larger than or equal to the mis-alignment value, but not limited thereto. For further description, a difference between the mis-alignment value and the spacing between the contact via pattern and the first conducting line pattern is preferably smaller than or equal to the additional length, i.e. a difference between the mis-alignment value and the spacing DL5 is preferably smaller than or equal to the additional length LR5, and a difference between the mis-alignment value and the spacing DL6 is preferably smaller than or equal to the additional length LR6, but not limited thereto.

After correcting the contact via patterns according to the relationship between the contact via pattern and the conducting line pattern which may be above the contact via pattern, corresponding positions of the contact via pattern and the conducting line pattern, which may be under the contact via pattern, are verified by the computing system. In step S23, the first modified contact via pattern is then verified whether spacing between the first modified contact via pattern and the third conducting line pattern is smaller than the critical space value by the computing system. In this embodiment, spacing RD1 between the first modified contact via pattern 321R1 and the third conducting line pattern 341, and spacing RD2 between the first modified contact via pattern 322R1 and the third conducting line pattern 342 may be verified whether the spacing RD1 and the spacing RD2 are smaller than the critical space value. Subsequently, in step S27, if the spacing between the first modified contact via pattern and the corresponding third conducting line pattern is not smaller than the critical space value, the first modified contact via pattern will not be further corrected. Conversely, in step S24, if the spacing between the first modified contact via pattern and the corresponding third conducting line pattern is smaller than the critical space value, a second modified contact via pattern may then be obtained by shrinking the first modified contact via pattern along a direction away from the spacing smaller than the critical space value. In this embodiment, because the spacing RD1 is smaller than the critical space value, a second modified contact via pattern 321R2 (presented by dotted lines in FIG. 8) may be obtained by shrinking the first modified contact via pattern 321R1 along the direction X1, which is away from the spacing RD1. Conversely, since the spacing RD2 is not smaller than the critical space value, the first modified contact via pattern 322R1 may not be further corrected. It is worth noting that spacing RD3 between the second modified contact via pattern 321R2 and the third conducting line pattern 341 is preferably larger than or equal to the critical space value for effectively separating the second modified contact via pattern 321R2 and the third conducting line pattern 341, but not limited thereto. In this embodiment, the mis-alignment value is substantially smaller than 10 nanometers, but the present invention is not limited to this and the mis-alignment value may vary depending on different exposure machines. Additionally, the critical space value in this embodiment is substantially smaller than 10 nanometers, but the present invention is not limited to this and the critical space value may vary depending on different process abilities and design rules.

Figure 10:
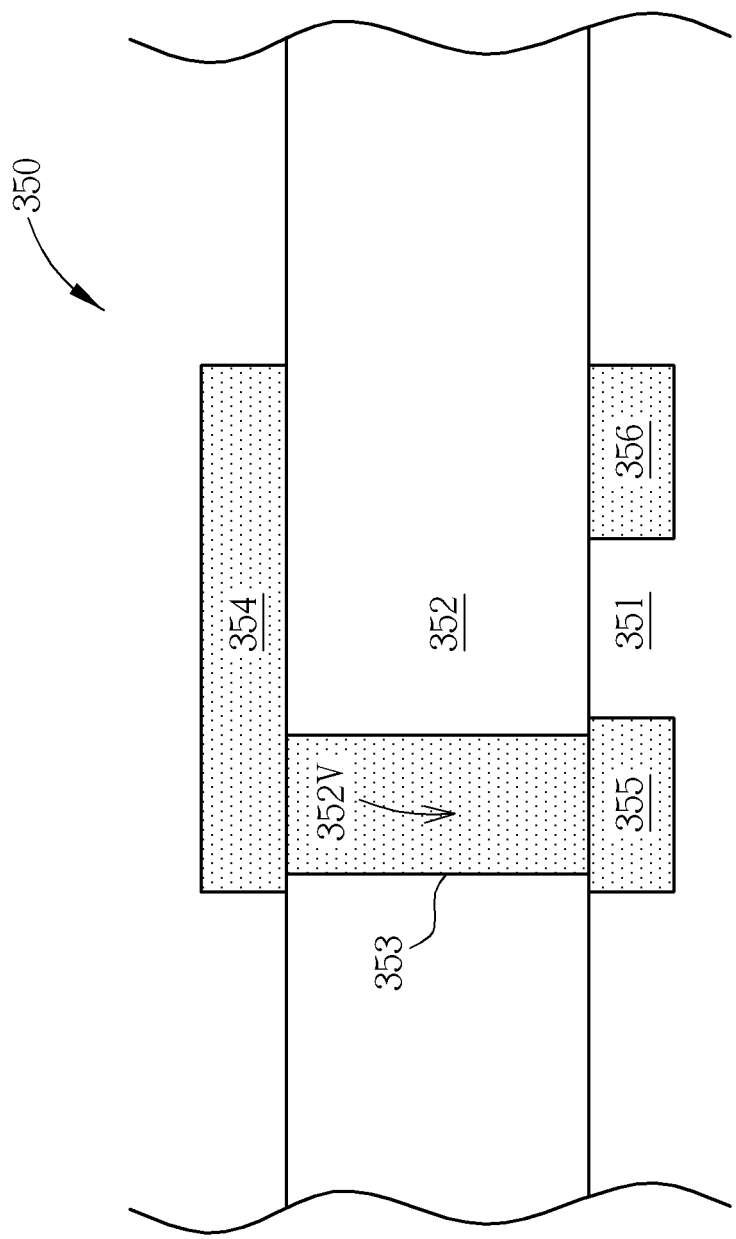
FIG. 10 is a schematic diagram illustrating a semiconductor device related to a method for correcting a layout pattern according to the second preferred embodiment of the present invention.

For further describing a semiconductor device manufactured by employing the method for correcting the layout pattern of this embodiment, please refer to FIG. 10 and FIG. 6. FIG. 10 is a schematic diagram illustrating a semiconductor device related to a method for correcting a layout pattern according to the second preferred embodiment of the present invention. As shown in FIG. 10, a semiconductor device 350 related to the method for correcting the layout pattern of this embodiment includes a semiconductor substrate 351, a dielectric layer 352, an upper metal conducting line 354, a lower metal conducting line 355, and a lower metal conducting line 356. The upper metal conducting line 352 may also be regarded as "metal 1", the lower metal conducting line 355 and the lower metal conducting line 356 may be regarded as "metal 2", but not limited thereto. The dielectric layer 352 has a contact via 352V, and the upper metal conducting line 354 may be electrically connected to the lower metal conducting line 355 via a contact plug 353 formed in the contact via 352V. As shown in FIG. 10 and FIG. 6, in the method for correcting the layout pattern in this embodiment, a photo mask, which is manufactured according to the first layout pattern 310 including the first conducting line pattern, may be employed for defining the upper metal conducting line 354, a photo mask, which is manufactured according to the third layout pattern 330 including the second conducting line pattern, may be employed for defining the lower metal conducting line 355, a photo mask, which is manufactured according to the third layout pattern 330 including the third conducting line pattern, may be employed for defining the lower metal conducting line 356, and a photo mask, which is manufactured according to the second layout pattern 320 including the contact via pattern, may be employed for defining the contact via 352V. Therefore, an effective contact area between the upper metal conducting line 354 and the contact plug 353 may not be influenced by the mis-alignment issue, when the first modified contact via pattern obtained by the method for correcting the layout pattern is employed for defining the contact via 352V. In other words, the effective contact area may be ensured by employing the modified contact via pattern because the modified contact via pattern is widen for overlapping the conducting line pattern which may be shifted by the mis-alignment issue. Additionally, the contact plug 353 will not be electrically connected to the lower metal conducting line 356 when the second modified contact via pattern obtained by the method for correcting the layout pattern is employed for defining the contact via 352V. Electrical properties and reliability of the semiconductor device 350 may then be enhanced by the method for correcting the layout pattern of this embodiment. It is worth noting that the method for correcting the layout pattern of this embodiment is not limited to be employed for manufacturing the semiconductor device 350 and may also be employed for manufacturing other semiconductor devices with overlapped structures including a doped region, a contact via or a conducting line.

Please refer to FIG. 9 and FIG. 8 again. As shown in FIG. 9 and FIG. 8, in the second preferred embodiment, a method for manufacturing a photomask is provided. The method for manufacturing the photomask in this embodiment includes the method for correcting the layout pattern described above, and the method for manufacturing the photomask in this embodiment further includes outputting the first modified contact via pattern to at least one photomask, and outputting the second modified contact via pattern to at least one photomask. In other words, the method for manufacturing the photomask in this embodiment further includes a step S25 after the step S24. In step S25, the second layout pattern 320, which includes the second modified contact via pattern such as the second modified contact via pattern 321R2, may be then output to at least one photomask. It is worth noticing that the second layout pattern 320 may further include the first modified contact via patterns such as the first modified contact via pattern 322R1 or the contact via patterns, which are not required to be corrected after being verified by the computing system, but the present invention is not limited to this. It is worth noting that the second modified contact via pattern 321R2 and the first modified contact via patterns 322R1 may also be output to different photomasks to form contact via by multiple exposure processes. The first layout pattern 310 including the first conducting line pattern and the third layout pattern 330 including the second conducting line pattern and the third conducting line pattern may be respectively output to at least one photomask without being corrected.

In the present invention, the problem that the layout patterns with upper patterns overlapping lower patterns may be influenced by mis-alignment issues is improved by correcting the contact via patterns in stead of correcting the conducting line patterns. In the method for manufacturing the photomask of this embodiment, the first modified contact via pattern or the second modified contact via pattern may be output to photomasks, and other conducting line patterns may not be corrected for alignment considerations between the upper patterns and the lower patterns. However, the first layout pattern 310, the second layout pattern 320, and the third layout pattern 330 may be further corrected by ordinary correcting procedures such as optical proximity correction, process rule check, and lithography rule check before being output to photomasks, but the present invention is not limited to this and related details will not be redundantly described.

To summarize the above descriptions, in the method for correcting the layout pattern and the method for manufacturing the photomask of the present invention, the contact via patterns are corrected for compensating the influence of mis-alignment issues that may occur in the subsequent exposure processes. In addition, spacing between the contact via pattern and the related conducting line pattern is also considered when correcting the contact via pattern, and the contact via pattern may then be corrected more appropriately within a permitted range. The process window of the semiconductor process employing the double-exposure technique, the multiple exposure technique, or the self-aligned via design may therefore be enhanced and the reliability of the semiconductor may also be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for correcting a layout pattern, comprising:
providing a first layout pattern and a second layout pattern, wherein the first layout pattern comprises a first conducting line pattern, the second layout pattern comprises at least one contact via pattern, and the contact via pattern at least partially overlaps the first conducting line pattern;
providing a mis-alignment value;
verifying whether spacing between the contact via pattern and the first conducting line pattern is smaller than the mis-alignment value by a computing system; and expanding the contact via pattern along a direction away from the spacing smaller than the mis-alignment value for generating a first modified contact via pattern.

2. The method of claim 1, wherein the method of expanding the contact via pattern comprises expanding the contact via pattern with an additional length.

3. The method of claim 2, wherein the additional length is larger than or equal to the mis-alignment value.

4. The method of claim 2, wherein a difference between the mis-alignment value and the spacing between the contact via pattern and the first conducting line pattern is smaller than or equal to the additional length.

5. The method of claim 1, wherein the mis-alignment value is substantially smaller than 10 nanometers.

6. The method of claim 1, further comprising providing a third layout pattern, wherein the third layout pattern comprises a second conducting line pattern and a third conducting line pattern, and the contact via pattern at least partially overlaps the second conducting line pattern.

7. The method of claim 6, further comprising:
providing a critical space value;
verifying whether spacing between the first modified contact via pattern and the third conducting line pattern is smaller than the critical space value by the computing system; and
shrinking the first modified contact via pattern along a direction away from the spacing smaller than the critical space value for generating a second modified contact via pattern, wherein spacing between the second modified contact via pattern and the third conducting line pattern is larger than or equal to the critical space value.

8. The method of claim 7, wherein the critical space value is substantially smaller than 10 nanometers.

9. A method for manufacturing a photomask, comprising:
providing a first layout pattern and a second layout pattern, wherein the first layout pattern comprises a first conducting line pattern, the second layout pattern comprises at least one contact via pattern, and the contact via pattern at least partially overlaps the first conducting line pattern;
providing a mis-alignment value;
verifying whether spacing between the contact via pattern and the first conducting line pattern is smaller than the mis-alignment value by a computing system;
expanding the contact via pattern along a direction away from the spacing smaller than the mis-alignment value for generating a first modified contact via pattern; and
outputting the second layout pattern to at least one photomask.

10. The method of claim 9, wherein the mis-alignment value is substantially smaller than 10 nanometers.

11. The method of claim 9, wherein the method of expanding the contact via pattern comprises expanding the contact via pattern with an additional length.

12. The method of claim 11, wherein the additional length is larger than or equal to the mis-alignment value.

13. The method of claim 11, wherein a difference between the mis-alignment value and the spacing between the contact via pattern and the first conducting line pattern is smaller than or equal to the additional length.

14. A method for manufacturing a photomask, comprising:
providing a first layout pattern, a second layout pattern, and a third layout pattern, wherein the first layout pattern comprises a first conducting line pattern, the second layout pattern comprises at least one contact via pattern, the third layout pattern comprises a second conducting line pattern and a third conducting line pattern, the contact via pattern at least partially overlaps the first conducting line pattern, and the contact via pattern at least partially overlaps the second conducting line pattern;
providing a mis-alignment value and a critical space value;
verifying whether spacing between the contact via pattern and the first conducting line pattern is smaller than the mis-alignment value by a computing system;
expanding the contact via pattern along a direction away from the spacing smaller than the mis-alignment value to generate a first modified contact via pattern;
verifying whether spacing between the first modified contact via pattern and the third conducting line pattern is smaller than the critical space value by the computing system;
shrinking the first modified contact via pattern along a direction away from the spacing smaller than the critical space value for generating a second modified contact via pattern, wherein spacing between the second modified contact via pattern and the third conducting line pattern is larger than or equal to the critical space value; and
outputting the second layout pattern to at least one photomask.

15. The method of claim 14, wherein the mis-alignment value is substantially smaller than 10 nanometers.

16. The method of claim 14, wherein the critical space value is substantially smaller than 10 nanometers.

17. The method of claim 14, wherein the method of expanding the contact via pattern comprises expanding the contact via pattern with an additional length.

18. The method of claim 17, wherein the additional length is larger than or equal to the mis-alignment value.

19. The method of claim 17, wherein a difference between the mis-alignment value and the spacing between the contact via pattern and the first conducting line pattern is smaller than or equal to the additional length.

* * * * *